United States Patent
Fayneh et al.

(10) Patent No.: US 7,120,839 B2
(45) Date of Patent: Oct. 10, 2006

(54) HIGH-ACCURACY CONTINUOUS DUTY-CYCLE CORRECTION CIRCUIT

(75) Inventors: Eyal Fayneh, Givatayim (IL); Ernest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 475 days.

(21) Appl. No.: 10/645,660

(22) Filed: Aug. 22, 2003

(65) Prior Publication Data

US 2005/0044455 A1  Feb. 24, 2005

(51) Int. Cl.
*G11B 20/22* (2006.01)
*G11B 20/24* (2006.01)

(52) U.S. Cl. ............... 714/700; 714/707
(58) Field of Classification Search ............ 714/700, 714/707, 709, 55; 375/376; 327/158, 175, 327/299, 293
See application file for complete search history.

(56) References Cited

U.S. PATENT DOCUMENTS

| | | | | |
|---|---|---|---|---|
| 5,727,037 A | * | 3/1998 | Maneatis | 375/376 |
| 5,991,221 A | * | 11/1999 | Ishikawa et al. | 365/226 |
| 6,100,735 A | * | 8/2000 | Lu | 327/158 |
| 6,191,613 B1 | * | 2/2001 | Schultz et al. | 326/39 |
| 6,924,480 B1 | * | 8/2005 | Van der Veer et al. | 250/287 |
| 6,967,514 B1 | * | 11/2005 | Kizer et al. | 327/175 |
| 6,981,185 B1 | * | 12/2005 | Davis et al. | 714/707 |

* cited by examiner

*Primary Examiner*—Albert Decady
*Assistant Examiner*—Dipakkumar Gandhi
(74) *Attorney, Agent, or Firm*—Fleshner & Kim LLP.

(57) ABSTRACT

A control circuit corrects duty-cycle distortion of clock signals accurately and with a fast and continuous response over a wide dynamic range. In one embodiment, the duty-cycle correction circuit includes a self-biased loop that corrects duty-cycle distortions to preferably less than +/−1%. The duty-cycle correction circuit also compensates for changes in a supply voltage. These corrections may take place on a continuous basis, not only during a testing period but also during normal operation of the host system driven by the clock signals.

32 Claims, 8 Drawing Sheets

HIGH-ACCURACY CONTINUOUS DUTY-CYCLE CORRECTION CIRCUIT

BACKGROUND OF THE INVENTION

1. Field of the Invention

The present invention relates to processing signals, and more particularly to a system and method for performing duty-cycle correction of clock and other frequency signals.

2. Background of the Related Art

Synchronous chips often use a latch design in which a logic path propagates in one phase (high or low) of a clock signal. In chips of this type, phase paths are influenced by duty-cycle distortion of the clock signal. This mainly occurs because of process variations and/or changes in the level of the voltage supply (e.g., changes in transistor characteristics with voltage supply level). As a result, if one of the clock phases in a synchronous chip is reduced, data may be sampled earlier than expected and this may lead to phase-path failure.

To overcome this problem, the frequency of the clock signal can be reduced to a value that compensates for and thus restores the original phase duration. For example, a 2% duty-cycle distortion in a 2 GHz clock frequency results in a 10 ps reduction of the clock phase. Thus, to restore the original clock phase period of 250 ps, the clock frequency may be reduced to 1920 MHz.

In higher frequency CPUs, phase-path designs have increasingly been used. As presently implemented, this design has a number of drawbacks, not the least of which include increasing the sensitivity of the maximum operating frequency of the CPU relative to duty-cycle distortion of a core clock signal. In fact, core clock duty-cycle distortion is one of the main factors that limits the maximum frequency of the CPU.

Conventional high-performance CPUs use static duty-cycle correction circuits. These circuits are based on a digitally controlled phase shifter that varies the clock phase duration with a predetermined resolution. The clock phase is shifted in automatic test equipment based on test programs to optimize the maximum frequency of the CPU. This approach is undesirable for at least two reasons. First, valuable tester time is wasted which makes the procedure inefficient. Second, testing is performed at only one voltage point, which tends to diminish the effectiveness of the overall process.

DETAILED DESCRIPTION OF PREFERRED EMBODIMENTS

Figure 1:
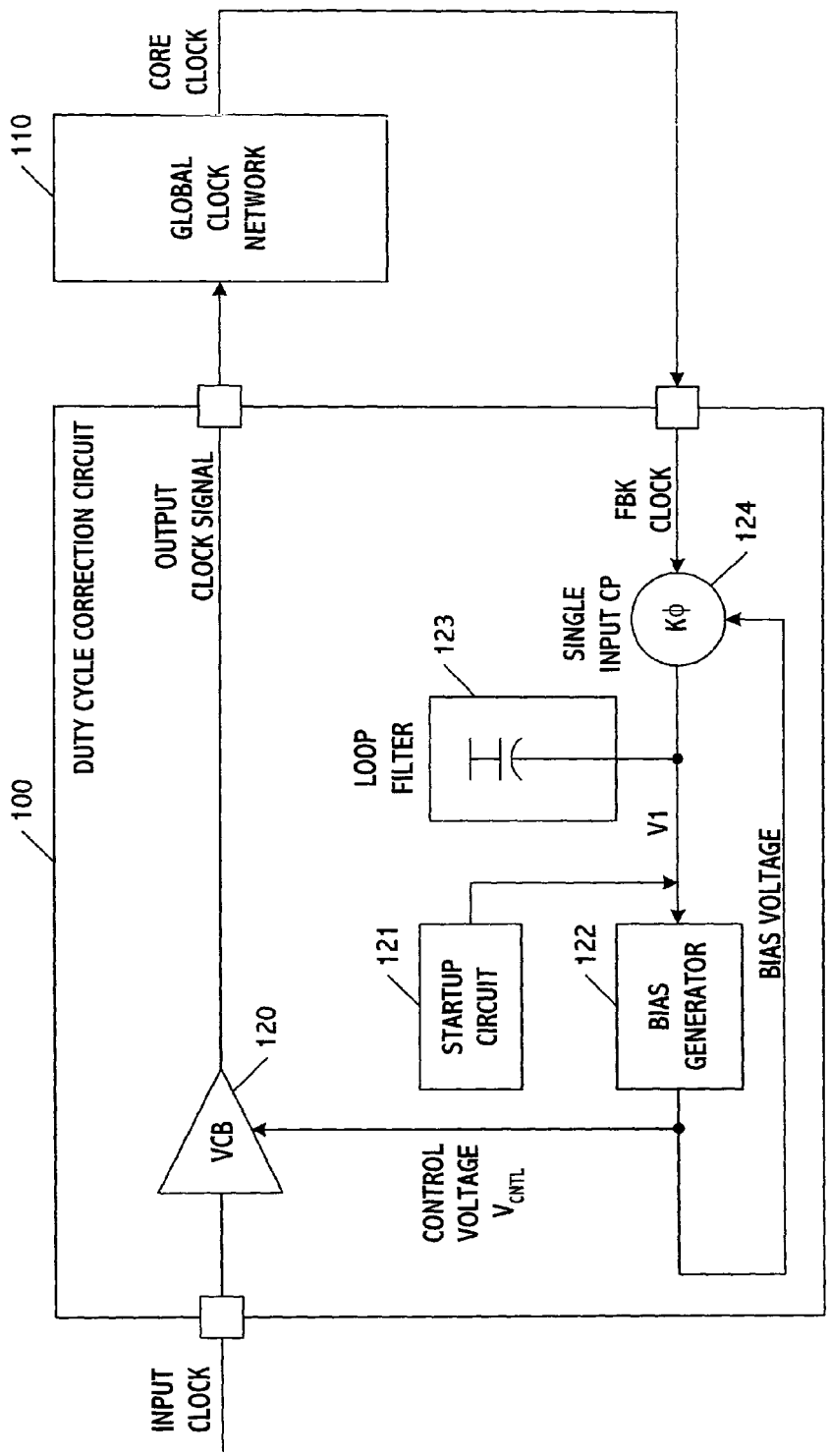
FIG. 1 is a diagram of a duty-cycle correction loop in accordance with one embodiment of the present invention.

FIG. 1 shows a duty-cycle correction loop according to one embodiment of the present invention. The loop includes a duty-cycle correction circuit 100 and a global clock network 110. The duty-cycle correction circuit includes a voltage-controlled buffer (VCB) 120, a startup circuit 121, and a bias generator 122 as well as a loop filter 123 and a single-input charge pump (CP) 124. Using these elements, the duty-cycle correction circuit generates a corrected output clock signal from an input clock signal.

The global clock network distributes the signal output from the correction circuit to other circuits. This may be accomplished using one or more buffers which control the timing and distribution of the correction circuit signal. The global clock network may therefore be considered a distribution network (i.e., one that takes the clock signal output from the correction circuit and merely distributes where needed), as opposed to one which changes the frequency of the clock signal. The signal output from the global clock network may be referred to as a core clock signal because, for example, it may be supplied to one or more logic blocks of a host circuit (e.g., chip, microprocessor, or system) as well as other areas.

The global clock network is usually a main source of duty-cycle distortion. The output of the global clock network (core clock) may therefore be used as a basis for measuring duty cycle distortion. The correction circuit ensures that the duty cycle of the core clock signal is maintained at a predetermined value (e.g., as close to 50% as possible) by continuously monitoring the core clock signal to detect duty cycle distortion and then correcting that distortion. Monitoring is performed by feeding the core clock signal back to the single-input CP 124 in a manner that will be described in greater detail below.

In addition to the core clock signal, the CP may optionally receive a bias voltage from bias generator 122. Using the feedback clock signal (or a combination of the feedback signal and bias voltage), the CP generates a current that is injected into loop filter 123 and the loop filter converts the charge pump current into a correction voltage V1 for input into the bias generator. The bias generator then generates an analog control voltage $V_{cntl}$ for input into the voltage-controlled buffer based on a predetermined bias. The voltage-controlled buffer then processes the input clock signal based on the analog control voltage to produce a output clock signal with a corrected duty cycle.

The duty cycle of the output clock signal depends on the control voltage provided by the bias generator, which control voltage is preferably applied to correct the duty cycle of the VCB output clock. on a continuous basis, not only during testing procedures but also during active operation of the global network clock. The output clock signal is then used as a basis for generating the core clock signal. As shown, the control voltage and bias voltage fed back to the charge pump may be the same signal.

In the foregoing embodiment, the voltage-controlled buffer is shown as being included in an input stage of the global clock network, that generates the core clock signal for driving the entire chip. To ensure stable performance, the core clock signal is fed back to the correction circuit for detecting duty-cycle distortion. This distortion is measured as a function of the output of the charge pump. More specifically, the average output current of the charge pump taken over a predetermined time (e.g., one core clock cycle) is proportional to and thus may be used as a basis for determining the duty-cycle distortion of the core clock signal.

Once the average output current of the charge pump has been determined, it is converted into a correction voltage (V1) by the loop filter 123. The bias generator 122 converts correction voltage V1 to a proportional change in the control voltage of the voltage-controlled buffer. This correction process is continued until the average output current of the charge pump is zeroed, which occurs, for example, when the duty cycle of the core clock signal is at a predetermined value, e.g., 50%. Bias generator 122 generates the self-bias voltage of the CP circuit 124 and a startup circuit 121 is used to generate an initial DC bias voltage to the CP.

Figure 2:
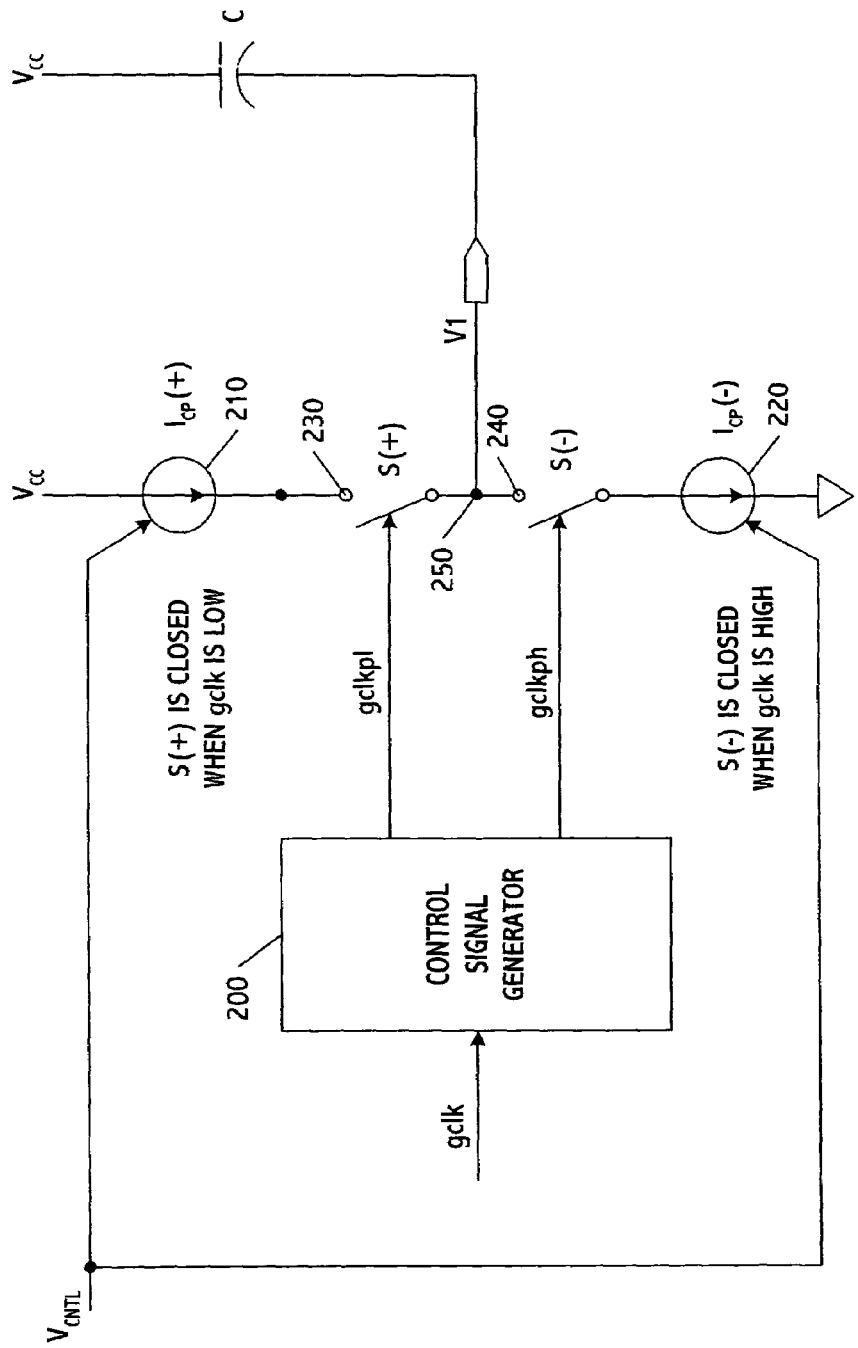
FIG. 2 is an equivalent block diagram of one possible implementation of a single-input charge pump which may be included in the duty-cycle correction loop.

FIG. 2 shows an equivalent block diagram of one possible implementation of the single-input charge pump. The charge pump includes a control signal generator 200, a positive current source 210, a negative current source 220, and two switches 230 and 240 which selectively connect the current sources to a node 250. This node outputs the aforementioned correction voltage V1 to loop filter 123 (shown here as including Vcc and capacitor C) and then to the bias generator. Generation of correction voltage V1 will now be explained in greater detail.

The core clock signal (shown as gclk in FIG. 2) drives the charge pump by initially being input into control signal generator 200. The control signal generator then generates two signal pulses (gclkpl and gclkph) to control the charge pump switches, which in turn respectively connect the positive and negative current sources Icp(+) and Icp(−) to node 250. The gclkpl signal has a duration equal the low phase of the gclk signal, while gclkph has a duration equal to the high phase of gclk. Whether or not duty-cycle distortion exists in the gclk signal may therefore be determined based on a comparison of the durations of the gclkpl and gclkph pulses.

When the gclk signal has a 50% duty cycle and thus no distortion exists, the two pulses, gclkph and gclkpl, have the same duration. Thus, the total charge injected into the loop filter capacitor is zero: Icp(+)=Icp(−). Put differently, Icp(+) and Icp(−) have equal absolute values but are opposite in sign, so that the average output current from node 250 is zero. Moreover, if gclk has a 50% duty cycle, then THIGH (gclkph)=THIGH(gclkpl). So, Icp(+)*THIGH(gclkpl)=Icp (−)*THIGH(gclkph). A distortion exists when the gclk signal does not have a 50% duty cycle.

When the duty cycle distortion of the core clock signal is below 50%, gclk may be considered to have a low value. The control signal generator then generates gclkpl to have a longer duration than gclkph. When the duty cycle distortion of the core clock signal is above 50%, gclk may be considered to have a high value. The control signal generator then generates gclkph to have a longer duration than gclkpl.

Figures 3A, 3B, 3C:
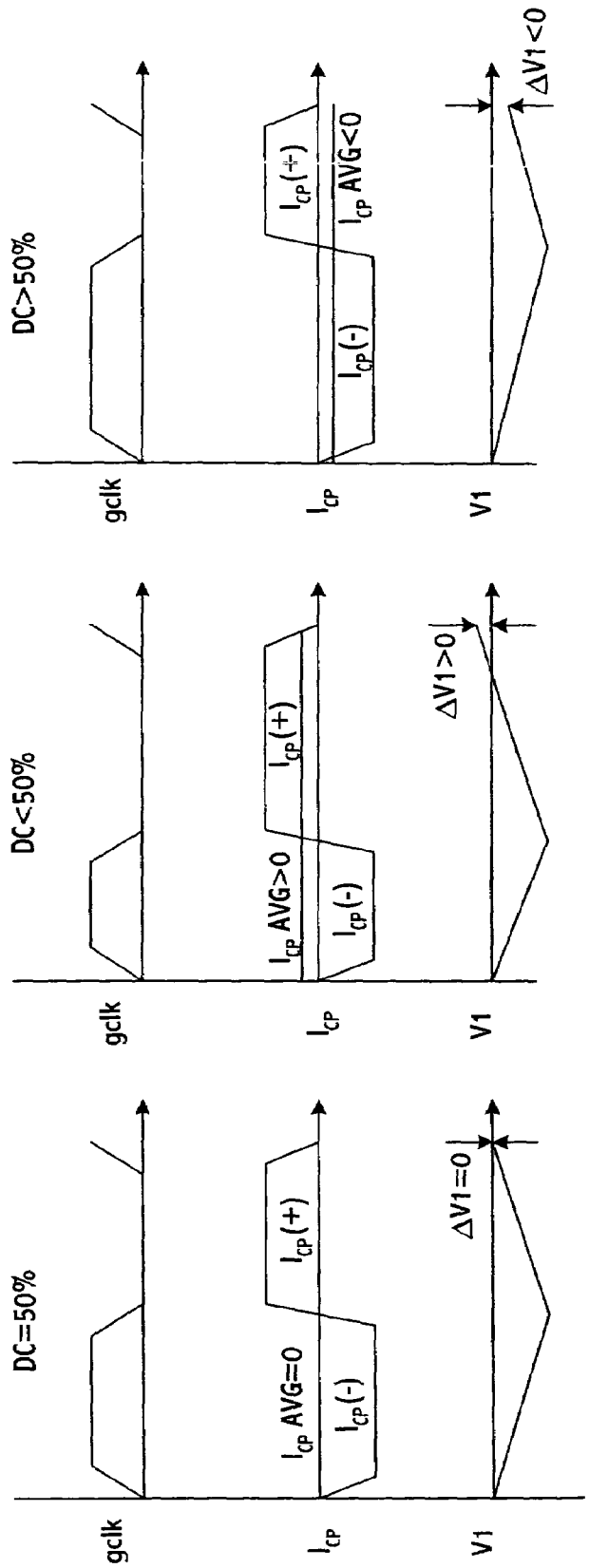
FIGS. 3(a)–(c) are graphs showing waveforms produced by the duty-cycle correction loop at respective ranges of duty-cycle values.

FIGS. 3(a)–(c) are graphs showing waveforms obtained for each of three duty-cycle ranges and how correction is or is not performed during each case. In each of these figures, the gclkph pulse used to control connection of the Icp(−) source to node 250 may correspond to a copy of the gclk signal and the gclkpl used to control connection of the Icp(+) source to node 250 may be an inverted copy of the gclk signal. The duration each current source is connected is reflected in the graph corresponding to the Icp output current.

In FIG. 3(a), the duty cycle of the core clock signal gclk is at a desired value, e.g., 50% corresponding to the case where half of the core clock signal has a high-level voltage and half is at a low-level voltage. The high-level voltage may be a value close to a power supply voltage and the low-level voltage a value close to ground. In this case, the time positive current source Icp (+) 230 is connected to node 250 equals the time negative current source Icp(−) 240 is connected. As a result, the average output current of the charge pump Icpavg is zero. Consequently, the average voltage V1 does not change ($\Delta V1=0$). Since the control voltage into VCB is proportional to V1, no duty cycle correction is required or performed under these circumstances.

In FIG. 3(b), the duty cycle of the core clock signal gclk is measured to be less than 50%, corresponding to a case where less than half of the core clock signal has a high-level voltage and more than half has a low-level voltage. In this case, the time positive current source Icp (+) 230 is connected is greater than the time negative current source Icp(−) 240 is connected. As a result, the average output current of the charge pump Icpavg is greater than zero. Consequently, the average voltage V1 changes to a value greater than zero ($\Delta V1>0$). This value drives the bias generator to generate a control voltage for the VCB to be greater than zero by a proportional amount, thereby correcting the duty cycle of the input clock signal. The corrected duty cycle is reflected in the output clock signal, which is used by the global clock network as a basis for generating the core clock signal.

In FIG. 3(c), the duty cycle of the core clock signal gclk is measured to be greater than 50%, corresponding to a case where less than half of the core clock signal has a low-level voltage and more than half a high-level voltage. In this case, the time positive current source Icp (+) 230 is connected is less than the time negative current source Icp(−) 240 is connected. As a result, the average output current of the charge pump Icpavg is less than zero. Consequently, the average voltage V1 changes to a value less than zero ($\Delta V<0$). This value drives the bias generator to generate a control voltage for the VCB to be less than zero by a proportional amount, thereby correcting the duty cycle of the input clock signal. The corrected duty cycle is reflected in the output clock signal, which is used by the global clock network as a basis for generating the core clock signal.

In each of the cases discussed above, the gclkph pulse has a duration equal to the time the gclk signal has a high-level value. This is reflected in the duration of Icp(−) in the graphs. Thus, in this sense gclkph may be said to correspond to a copy of the gclk signal. The gclkpl pulse has a duration equal to the time the gclk signal has a low-level value. This is reflected in the duration of Icp(+) in the graphs. Thus, in this sense gclkpl may be said to correspond to an inverted copy of the gclk signal.

The average change in voltage $\Delta V1$ is proportional to the average current at the charge pump output and therefore is proportional to the duty cycle distortion of the core clock signal. The control voltage of the voltage-controlled buffer VCB 120 is, in turn, inversely proportional to V1, e.g., $V_{cntl}$ decreases when V1 increases. The voltage-controlled buffer functions to correct the duty cycle of the input clock signal to thereby correct the duty cycle in the core clock signal. This may be accomplished in the following exemplary manner.

The VCB may have a fixed delay for the rising edge of the input clock signal (rise-rise delay) and a voltage-controlled delay for the falling edge of the input clock signal (fall-fall delay). The fall-fall delay is directly proportional to the control voltage input into the VCB. Thus, if the control voltage increases (e.g., to a value greater than zero as shown in FIG. 3(b)), the fall-fall delay will increase. This will cause the duty cycle of the clock signal to increase, which is desirable in the case of FIG. 3(b) where the duty cycle was measured to be less than 50%. If the control voltage decreases (e.g., to a value less than zero as shown in FIG. 3(c)), the fall-fall delay will decrease. This will cause the duty cycle of the clock signal to decrease, which is desirable in the case of FIG. 3(c) where the duty cycle was measured to be greater than 50%.

Figure 4:
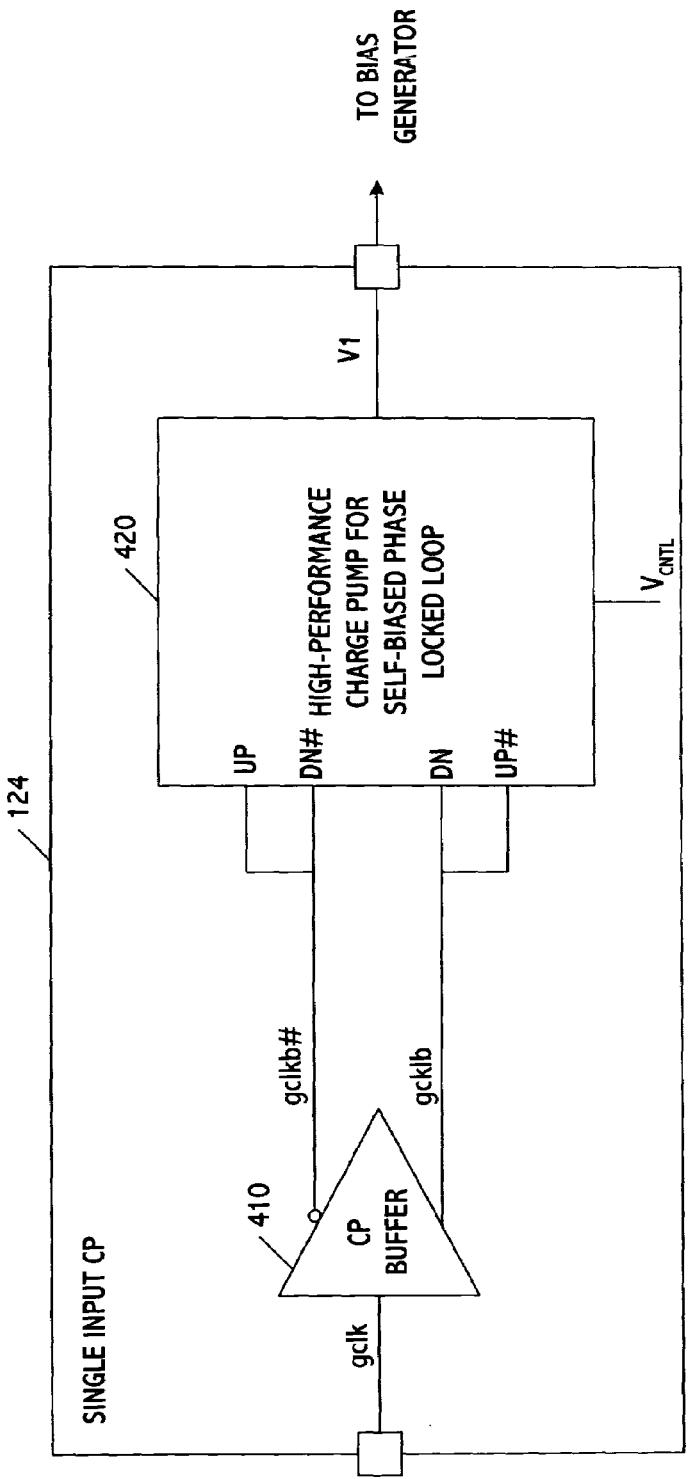
FIG. 4 is a functional block diagram of one possible implementation of a single-input charge pump which may be included in the duty-cycle correction loop.

FIG. 4 is a functional block diagram of one possible implementation of the single-input charge pump. The charge pump preferably includes a CP buffer 410 and a high-performance charge pump 420. The buffer receives the core clock signal gclk and selectively generates one of two complementary control signals gclkb and gclkb# to operate the high-performance CP. The first signal (gclkb) is high when gclk has a high-level voltage, while gclkb# is high when gclk has a low-level voltage. Operation of the single-input charge of FIG. 4 is equivalent to the operation of the control signal generator explained with reference to FIGS. 2 and 3(a)–(c), where gclkb and gclkb# operate in a manner similar to gclkph and gclkpl. The single-input CP preferably has the same steady-state input phase offset as the high-performance CP (<2 pS). Accordingly, the single-input CP is a high accuracy duty-cycle distortion measurement circuit.

Figure 5:
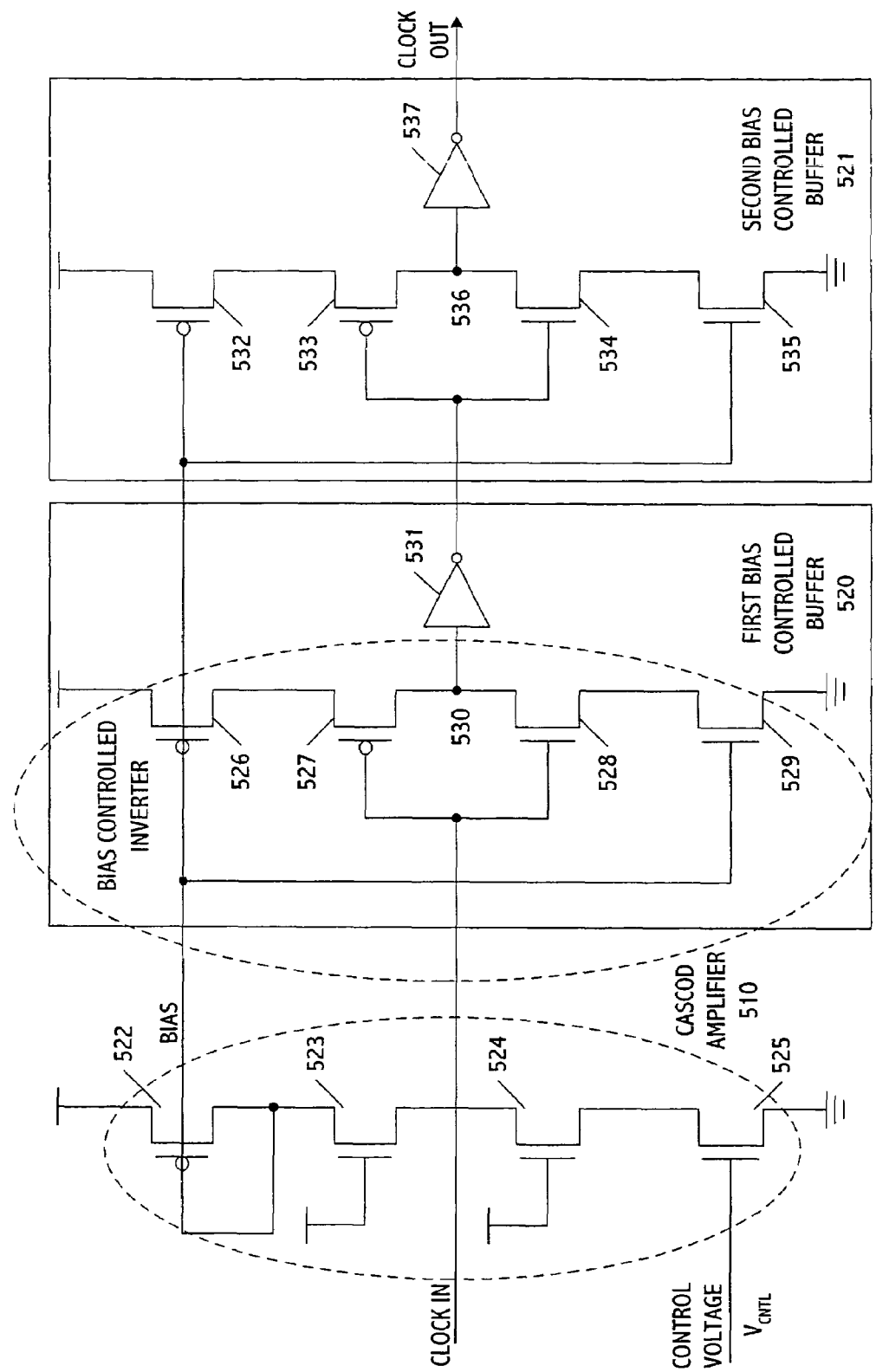
FIG. 5 is a diagram showing one possible implementation of a voltage-controlled buffer which may be included in the duty-cycle correction loop.

FIG. 5 shows one possible implementation of voltage-controlled buffer 120. The buffer includes a cascode amplifier 510 which generates a bias voltage for two serial bias-controlled buffers 520 and 521. The cascode amplifier includes a diode-connected transistor 522 serving as an active load, two (always-on) transistors 523 and 524 connected in series, and an current-source transistor 525. Transistor 525 acts as a current source controlled by control voltage $V_{cntl}$ output from bias generator 122, however those skilled in the art can appreciate that this control voltage may be connected to one of the other two transistors if desired. All transistors may be implemented in NMOS except transistor 522 where PMOS is preferable.

Both bias-controlled buffers are constructed from a bias-controlled inverter followed by a regular inverter. In the first bias-controlled buffer, the bias-controlled inverter is formed from two complementary transistors, PMOS transistor 527 and NMOS transistor 528. The PMOS transistor 526 and NMOS transistor 529 set the drive current ("strength") of the inverter. (PMOS 526 and NMOS 529 act as current sources controlled by bias voltage). In the second bias-controlled buffer, the bias-controlled inverter is formed from complementary transistors 533 and 534 and the bias control is performed by transistors 532 and 535.

In operation, the bias circuit affects the drive strength of the inverter, by controlling the amount of current the inverter can drive in the up or down transition. More specifically, the control voltage $V_{cntl}$ from bias generator 122 determines up and down transition currents of the bias-controlled inverter in the first buffer stage and therefore affects the output slope of the bias-controlled buffers. When $V_{cntl}$ decreases, the bias voltage increases, the up-transition slope at the bias-controlled inverter output is increased and the down-transition slope decreases. Thus, the high-phase width of the inverter output clock 530 is decreased and the low-phase width of the inverter output clock 530 is increased. After a second inverter 531, the duty cycle of the VCB output clock increases. When $V_{cntl}$ voltage increases, the low-phase width of the output clock is increased and the high-phase width is reduced. Accordingly, the duty cycle of the VCB output clock decreases.

To achieve this operation, NMOS transistor 525 acts as a current source and is never off. When $V_{cntl}$ increases, the current of transistor 525 increases and bias (in FIG. 5) decreases (transistor 522 acts as a diode, and as the current increases the voltage drop across it increases, as Vbias decreases).

Transistors 526 and 532 serve as current sources whose current is controlled by the bias signal, and transistors 529 and 535 also act as current sources controlled by the bias signal. When the bias signal decreases, the currents of current sources 526 and 532 increase, while the currents of current sources 529 and 535 decrease. The up transition in nodes 530 and 536 is faster, the down transistor is slower. Thus, the up transition slope of inverter 531 (537 respectively) is slower, and the down transition is faster. The high phase at the output is decreased, and the low phase is increased. The voltage-controlled buffer affects the delay of the rise transition and the fall transition by different amounts, compensating for the duty-cycle distortion. If the core clock signal has a short high phase (duty cycle <50%), the voltage-controlled buffer acts to increase the high phase (faster slope up, slower slope down).

Performance-wise, the correction circuit dynamically adjusts the output clock signal (and thus the core clock signal) to reduce or eliminate duty-cycle distortion or corrects duty cycle back to any value desired based on the intended application of the host circuit. This dynamic control is implemented through the generation of an analog control signal $V_{cntl}$, which is unlike other proposed correction circuits which attempt to reduce duty-cycle distortion by making adjustments in predetermined discrete increments, e.g., in increments of 5 ps. This approach is undesirable because it limits accuracy and the extent to which correction can be made. For example, when duty-cycle distortion is only 2 ps, a digital system which makes adjustments in discrete 5 ps increments will at best leave a distortion of 3 ps for one phase that cannot be compensated for. At least one embodiment of the duty-cycle correction circuit of the present invention can, through its continuous (e.g., non-discrete) and dynamic approach, generate an analog correction value that can eliminate substantially all 5 ps of distortion.

Other proposed correction circuits are also dependent on process characteristics, voltage, and temperature. Because of this dependence, the accuracy of correction may be affected. One or more embodiments of the duty-cycle correction circuit of the present invention are independent of these influences and thus can achieve superior performance. Also, other proposed correction circuits have only been implemented during testing processes, not during operation of the host circuit or in otherwise real system applications. One or more embodiments of the correction circuit of the present invention corrects duty-cycle distortion continuously and automatically, irrespective of whether the host system is operating our under test.

Figure 6:
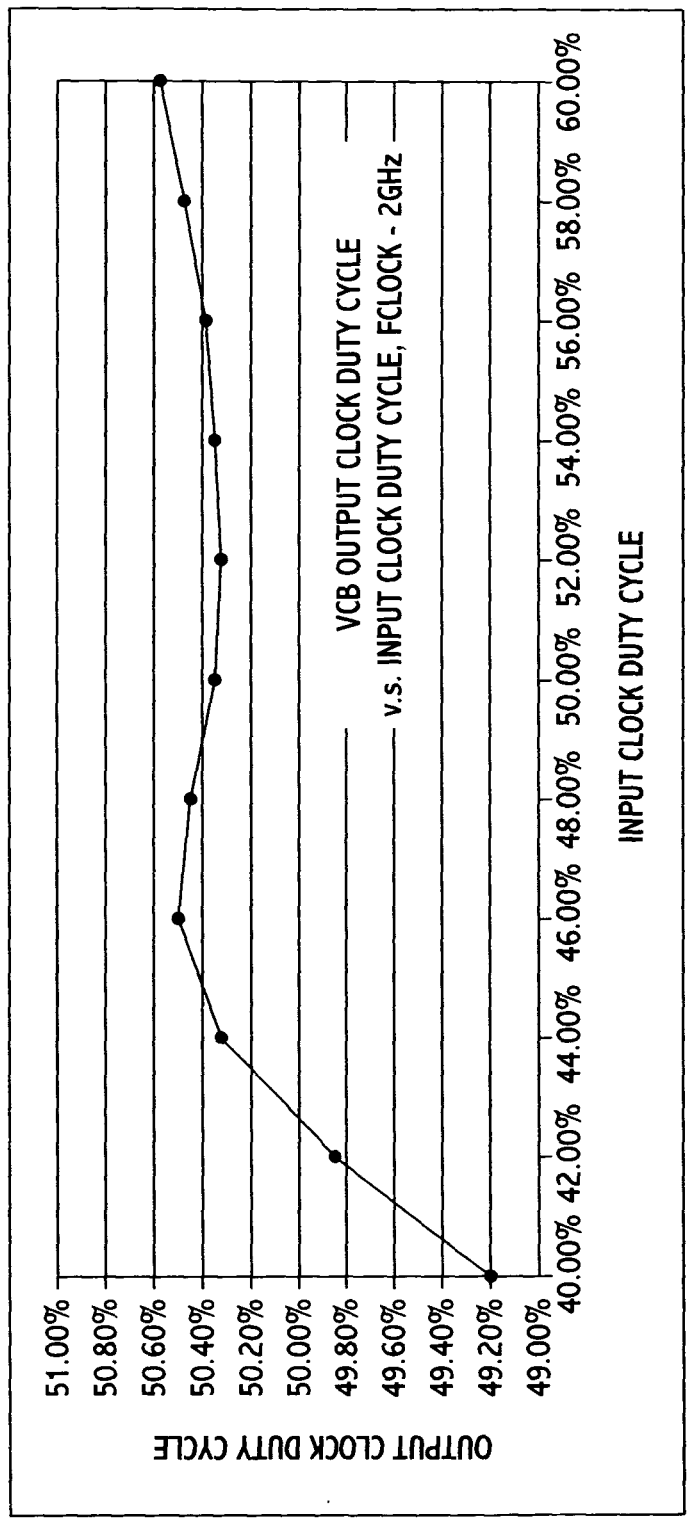
FIG. 6 is a graph showing an exemplary level of performance that may be attained by at least one embodiment of a duty-cycle correction loop of the present invention.

FIG. 6 is a graph showing a level of performance attainable by at least one embodiment of a duty-cycle correction circuit according to the present invention. The graph plots output clock signal duty cycle as a function of input clock signal duty cycle for a 2 GHz clock frequency measured over a wide range of duty-cycle distortion (40%–60%) at the input loop. In this example, the output clock duty-cycle distortion is less than +/−1% for 40%–60% duty-cycle distortion in the input clock. Moreover, for a narrow interval, a 45%–55% (duty-cycle distortion due to process variability) output clock duty cycle distortion is less than +/−0.1%.

For example, a 40% input clock duty cycle (200 ps HIGH, 300 ps LOW) produces an output clock duty cycle of 49.2% (246 ps HIGH, 254 ps LOW). These and other plot points on the curve show that the duty-cycle correction circuit (and more specifically the voltage-controlled buffer) achieves steady state performance, which is a level of performance which cannot be obtained with discrete solutions. The graph also shows that the same level of performance may be obtained for different supply voltages (and adjusts when the supply voltage varies). In contrast, other circuits perform correction at a single-voltage/single-frequency point.

Figure 7:
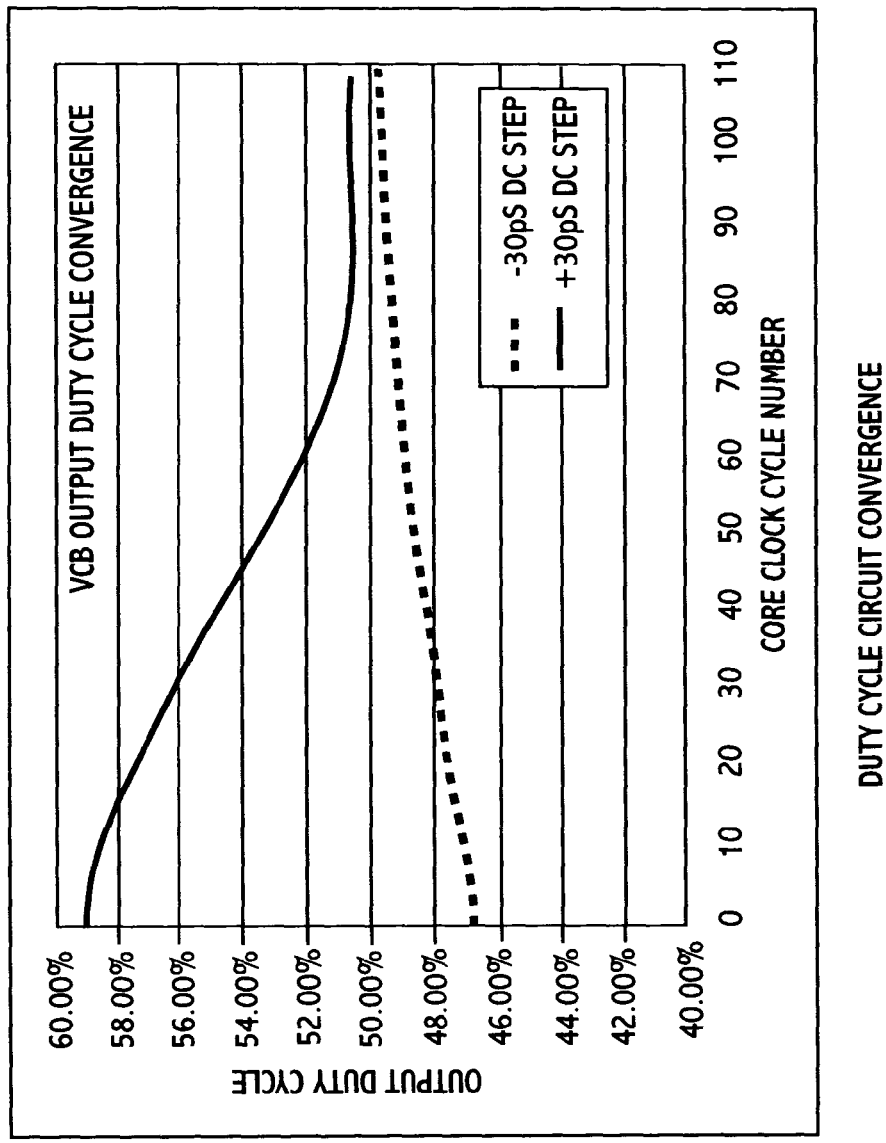
FIG. 7 is a graph showing loop convergence that may be obtained by the duty-cycle correction loop for the illustrative case of a +/−30 ps duty-cycle increment.

FIG. 7 is a graph showing an example of a loop convergence that may be obtained for a +/−30 ps duty-cycle increment at the input clock. More specifically, a +/−30 ps increment is corrected to a less than 2% duty cycle distortion in approximately 50 core clock cycles.

Figure 8:
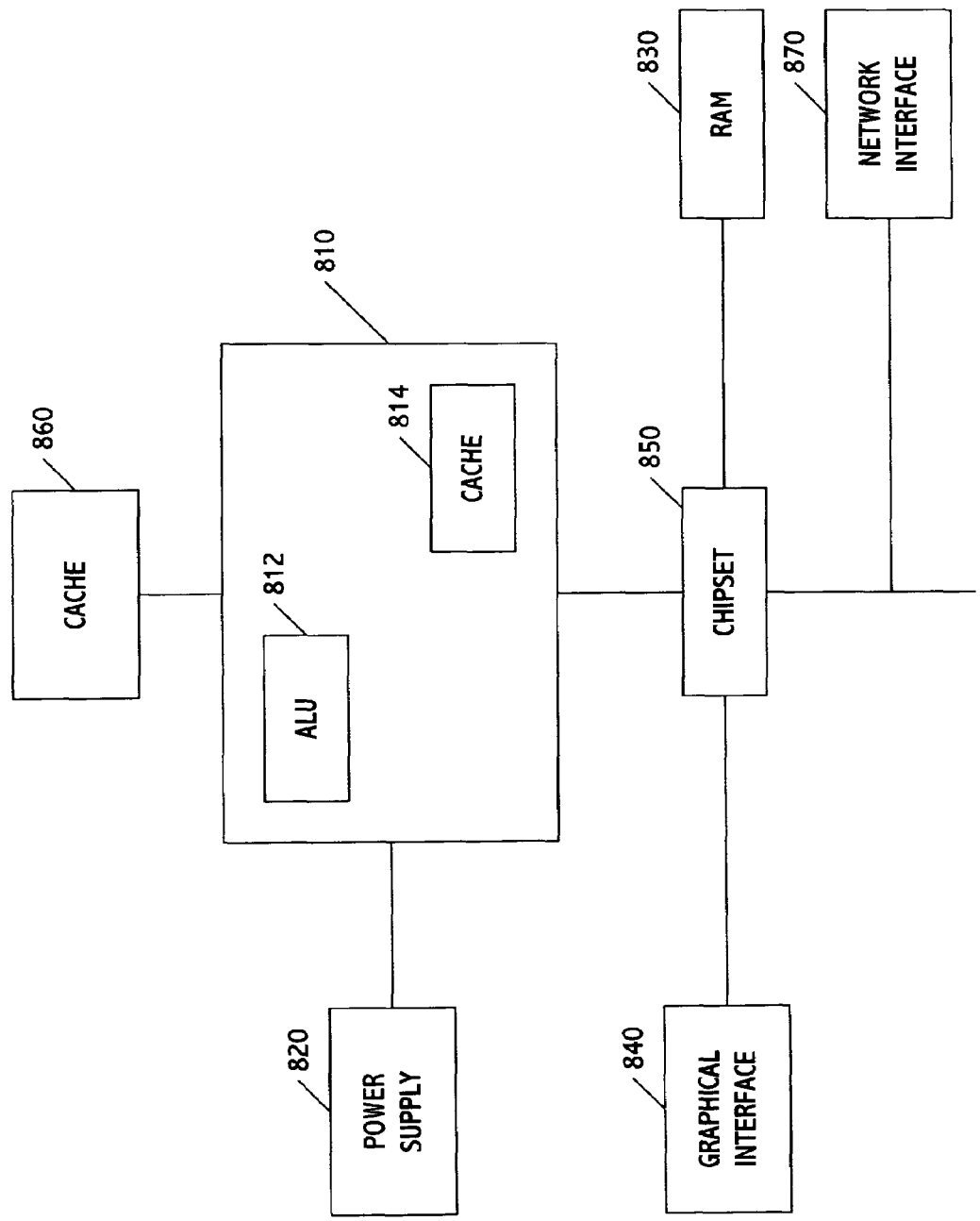
FIG. 8 is a diagram showing a processing system which may include one or more embodiments of the duty-cycle correction loop of the present invention.

FIG. 8 is a diagram of a processing system which includes a processor 810, a power supply 820, and a memory 830 which, for example, may be a random-access memory. The processor 810 may include an arithmetic logic unit 812 and an internal cache 814. In addition to these elements, the processing system may optionally include a graphical interface 840, a chipset 850, a cache 860, and a network interface 870.

The duty cycle correction circuit 100 may be used to generate timing and/or clock signals for controlling operations of the chipset or processor, or for controlling the transfer of data between either of these elements and the memory. Those skilled in the art can appreciate that these applications are only illustrative, as the duty-cycle correction circuit may be applied in such a processing system to generate or correct any type of timing or clock signals required. Also, in accordance with at least one embodiment, duty-cycle correction is performed continuously and dynamically, i.e., correction is not performed in discrete increments like many digital systems which have been proposed but rather involves performing analog control which preferably results in precisely matching and thus altogether eliminating duty-cycle distortion.

One or more embodiments of the present invention have been described in the exemplary case where duty cycle of a clock signal is corrected to 50%. Variations include correcting the duty cycle to values other than 50%, for example, when the intended application and/or host system incorporating the duty cycle correction circuit requires performance of this type.

The description is merely exemplary and not to be construed as limiting of any one or more of the embodiments of the present invention described herein. Rather, the description is merely intended to be illustrative and not to limit the scope of the claims in any way. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A system for correcting duty-cycle distortion, comprising:
    a measurement circuit to measure duty-cycle distortion in a first clock signal, the measurement circuit including:
        (a) a single-input charge pump driven by the first clock signal,
        (b) a loop filter to output a voltage corresponding to an average of current from the charge pump over a predetermined time, and
        (c) a bias generator to generate an analog correction signal based on the voltage output from the loop filter; and
    a correction circuit to dynamically adjust a delay of at least one edge of a second clock signal based on the analog correction signal received from the bias generator to reduce the duty-cycle distortion in the first clock signal, the first clock signal being generated based on the second clock signal.

2. The system of claim 1, wherein the delay adjustment by the correction circuit causes durations of high-phase and low-phase portions of the second clock signal be adjusted to reduce the duty-cycle distortion in the first clock signal to substantially zero.

3. The system of claim 1, wherein the analog correction signal adjusts the at least one edge of the second clock signal by an amount which corrects substantially all the duty-cycle distortion in the first clock signal.

4. The system of claim 1, wherein the single-input charge pump includes:
    a signal generator;
    first and second switches;
    a positive current source; and
    a negative current source,
    wherein the first and second switches to respectively connect the positive current source and the negative current source to an output node to generate the charge pump current to be averaged.

5. The system of claim 4, wherein the first and second switches to connect the positive current source and the negative current source to the output node for different periods of time based on the duty cycle of the first clock signal to generate the charge pump current to be averaged.

6. The system of claim 1, wherein the correction circuit to adjust a delay of a first edge of the second clock signal based on the analog correction signal from the bias generator and maintains a second edge of the second clock signal at a fixed delay, to reduce the duty-cycle distortion in the first clock signal.

7. The circuit of claim 1, wherein the buffer to adjust a delay of a first edge of the second clock signal based on the analog control voltage from the bias generator and maintains a second edge of the second clock signal at a fixed delay, to reduce the duty-cycle distortion in the first clock signal.

8. The system of claim 1, wherein the analog correction signal is indicative of an offset voltage generated by the charge pump current as a result of the duty-cycle distortion in the first clock signal.

9. The system of claim 1, wherein the analog correction signal is inversely proportional to the voltage that corresponds to the average current from the charge pump over said predetermined time.

10. The system of claim 9, wherein the buffer circuit includes:
    at least one inverter to invert the second clock signal; and
    a plurality of current sources to set a drive strength of the at least one inverter based on the bias voltage from the cascode amplifier.

11. The system of claim 10, wherein the current sources set the drive strength by controlling a transition slope of a signal output from the inverter, to thereby adjust high-phase and low-phase portions of the first clock signal.

12. The system of claim 11, wherein the bias voltage is inversely proportional to the analog correction signal.

13. The system of claim 9, wherein the cascode amplifier includes:
an active load;
a first transistor coupled to the active load;
a second transistor connected to the first transistor; and
a current-source transistor coupled to the second transistor and having a gate coupled to receive the analog correction signal, the active load to output the bias voltage for controlling the buffer circuit.

14. The system of claim 13, wherein the active load includes a diode-connected transistor.

15. The system of claim 14, wherein the diode-connected transistor outputs the bias voltage in inverse proportion to the analog correction signal.

16. The system of claim 15, wherein the first and second transistors and the current-source transistor are of a first conductivity and the diode-connected transistor is of a second opposing conductivity.

17. The system of claim 15, wherein the first and second transistors and the current-source transistor are maintained in a same state.

18. The system of claim 1, wherein the correction circuit includes a voltage-controlled buffer comprising:
a buffer circuit;
a cascode amplifier coupled to the buffer circuit, the buffer circuit to delay the at least one edge of the second clock signal by an amount controlled a bias voltage generated by the cascode amplifier based on the analog correction signal from the bias generator.

19. A duty-cycle correction circuit, comprising:
a detection circuit to receive a first clock signal having duty-cycle distortion; and
a voltage-controlled buffer to continuously adjust a delay of at least one edge of a second clock signal to reduce the duty-cycle distortion in the first clock signal, the first clock signal generated based on the second clock signal and the buffer to delay the at least one edge of the second clock signal based on an analog control voltage received from the detection circuit, the detection circuit including:
(a) a single-input charge pump to receive the first clock signal and a bias voltage; and
(b) a bias generator to generate the bias voltage and said analog control voltage input into the buffer based on an average current output from the single-input charge pump.

20. The circuit of claim 19, wherein the voltage-controlled buffer corrects the second clock signal to produce reduced phase distortion in the first clock signal.

21. The circuit of claim 20, wherein a response time of the system to reduce said phase distortion is approximately 50 nS.

22. The circuit of claim 19, further comprising:
a startup circuit to generate an initial DC bias voltage for the single-input CP; and
a loop filter to generate a correction voltage corresponding to the average charge pump current, the bias generator to generate the analog control voltage based on the correction voltage generated by the loop filter.

23. The circuit of claim 19, wherein the bias generator compensates for changes in a supply voltage.

24. The circuit of claim 19, wherein the first clock signal is received from a global clock network.

25. A method for correcting duty-cycle distortion, comprising:
measuring duty-cycle distortion in a first clock signal by:
(a) driving a single-input charge pump with the first clock signal,
(b) generating a voltage corresponding to an average of current output from the charge pump over a predetermined time, and
(c) generating an analog correction signal based on the voltage output from the loop filter; and
dynamically adjusting a delay of at least one edge of a second clock signal based on the analog correction signal received from the bias generator to reduce the duty-cycle distortion in the first clock signal, the first clock signal generated based on the second clock signal.

26. The method of claim 25, wherein a loop filter generates the average charge pump current based on durations of high-phase and low-phase portions of the first clock signal.

27. The method of claim 26, wherein the delay of the at least one edge of the second clock signal is adjusted based on the analog correction signal to cause the duration of the high-phase portion of the first clock signal to at least substantially equal the duration of the low-phase portion of the first clock signal.

28. The method of claim 25, wherein dynamically adjusting includes:
adjusting the delay of the first edge of the second clock signal based on the analog correction signal; and
maintaining a second edge of the second clock signal at a fixed delay to reduce the duty-cycle distortion in the first clock signal.

29. The method of claim 25, wherein the analog correction signal adjusts the at least one edge of the second clock signal by an amount which corrects substantially all the duty-cycle distortion in the first clock signal.

30. A processing system, comprising:
a circuit; and
a correction circuit to correct duty-cycle distortion of a first frequency signal input into the circuit, said correction unit comprising:
a measurement unit to measure duty-cycle distortion in the first frequency signal, the measurement circuit including:
(a) a single-input charge pump driven by the first frequency signal,
(b) a loop filter to output a voltage corresponding to an average of current from the charge pump over a predetermined time, and
(c) a bias generator to generate an analog correction signal based on the voltage output from the loop filter; and
a correction unit to dynamically adjust a delay of at least one edge of a second frequency signal based on the analog correction signal received from the bias generator to reduce the duty-cycle distortion in the first frequency signal, the first frequency signal generated based on the second frequency signal.

31. The processing system of claim 30, wherein said circuit includes a chipset, processor, or memory.

32. The system of claim 30, wherein the correction unit to adjust a delay of a first edge of the second frequency signal based on the analog correction signal from the bias generator and maintains a second edge of the second frequency signal at a fixed delay, to the duty-cycle distortion in the first frequency signal.

* * * * *